United States Patent
Duncan et al.

(10) Patent No.: US 9,417,266 B2
(45) Date of Patent: Aug. 16, 2016

(54) IMPLEMENTING HANDHELD TRANSFER IMPEDANCE PROBE

(71) Applicant: International Business Machines Corporation, Armonk, NY (US)

(72) Inventors: Timothy P. Duncan, Rochester, MN (US); Edward C. Gillard, Mantorville, MN (US); Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 14/156,866

(22) Filed: Jan. 16, 2014

(65) Prior Publication Data
US 2015/0198643 A1 Jul. 16, 2015

(51) Int. Cl.
*G01R 31/02* (2006.01)
*G01R 1/067* (2006.01)
*G01R 15/20* (2006.01)
*G01R 19/165* (2006.01)

(52) U.S. Cl.
CPC .......... *G01R 15/207* (2013.01); *G01R 1/06772* (2013.01); *G01R 19/16561* (2013.01)

(58) Field of Classification Search
CPC .. G01R 1/06772; G01R 1/24; G01R 31/2822; G01R 1/04; G01R 1/067; G01R 1/06722; G01R 1/06788; G01R 31/02
USPC .......... 324/691, 72, 754, 755, 762, 761, 765, 324/72.5
See application file for complete search history.

(56) References Cited

U.S. PATENT DOCUMENTS

| | | | |
|---|---|---|---|
| 4,721,903 A * | 1/1988 | Harsch et al. | 324/72.5 |
| 6,281,690 B1 * | 8/2001 | Frey | 324/754.07 |
| 6,369,592 B1 | 4/2002 | Majka et al. | |
| 6,407,562 B1 | 6/2002 | Whiteman | |
| 6,704,670 B2 * | 3/2004 | McTigue | 702/66 |
| 6,734,689 B1 * | 5/2004 | Yang | 324/755.02 |
| 6,937,039 B2 | 8/2005 | Barr et al. | |
| 7,362,112 B2 * | 4/2008 | Yang et al. | 324/755.02 |
| 7,982,480 B2 * | 7/2011 | Ghadaksaz | 324/755.02 |
| 8,327,727 B2 | 12/2012 | Caudill et al. | |
| 2006/0267604 A1 * | 11/2006 | Yang | 324/754 |
| 2007/0167035 A1 | 7/2007 | Duke | |
| 2008/0074125 A1 * | 3/2008 | Saulnier | G01R 1/06788 324/754.02 |
| 2011/0025358 A1 * | 2/2011 | Kazama | G01R 1/07371 324/755.01 |
| 2012/0323513 A1 | 12/2012 | Prance et al. | |
| 2013/0014983 A1 * | 1/2013 | Korson et al. | 174/378 |

OTHER PUBLICATIONS

Shinagawa, Mitsuru et al., "A Novel High-Impedance Probe forMulti-Gigahertz Signal Measurement", IEEE Transactions on Instrumentation and Measurement, vol. 45, No. 2, Apr. 1996.

* cited by examiner

*Primary Examiner* — Tung X Nguyen
*Assistant Examiner* — Neel Shah
(74) *Attorney, Agent, or Firm* — Joan Pennington (57) ABSTRACT

A method and structures implement an enhanced handheld transfer impedance probe including a rigid probe housing body that carries a pair of coaxial RF connectors providing connections to a network analyzer. A base member includes a respective pair of independent electrical contacts and a common interconnect electrical contact. Each of the respective electrical contacts includes a respective associated electrically conductive compressible pad. Each respective compressible pad extends between rigid stops having a set height to limit gasket compression and enable repeatable gasket compressions for repeatable measurements with the handheld transfer impedance probe. An interconnection structure includes respective interconnects connecting between the coaxial RF connectors and respective electrical contacts. The respective interconnects are contained within the rigid probe housing body and arranged to prevent movement of the respective electrical contacts and the associated electrically conductive compressible pads.

20 Claims, 11 Drawing Sheets

IMPLEMENTING HANDHELD TRANSFER IMPEDANCE PROBE

FIELD OF THE INVENTION

The present invention relates generally to the data processing field, and more particularly, to a method, and structures for implementing an enhanced handheld transfer impedance probe.

DESCRIPTION OF THE RELATED ART

Current state-of-the-art portable probes do not exist that can be used to evaluate an existing joint on an enclosure at high frequencies. The appropriate measurement is a transfer impedance measurement that consists of running a current through the joint and measuring the voltage across the joint. The current is injected and referenced on the other side of the joint. If the joint is perfect then the voltage at the joint will be ideally zero.

The measurement is called a transfer impedance measurement since the input current produces an output voltage. Thus the output voltage divided by the input current is impedance and is transferred across the joint. To perform a frequency selective measurement usually a vector network analyzer is used whereby port one is used to provide the current while port two is used to measure the voltage, such as an S21 measurement.

A need exists for an effective mechanism and structures for implementing an enhanced handheld transfer impedance probe.

SUMMARY OF THE INVENTION

A principal aspect of the present invention is to provide a method, and structures for implementing an enhanced handheld transfer impedance probe. Other important aspects of the present invention are to provide such method, and structures substantially without negative effects and that overcome many of the disadvantages of prior art arrangements.

In brief, a method and structures are provided for implementing an enhanced handheld transfer impedance probe. A rigid probe housing body carries a pair of coaxial RF connectors providing connections to a network analyzer. A rigid probe housing base member includes a respective pair of independent electrical contacts and a common interconnect electrical contact. Each of the respective electrical contacts includes a respective associated electrically conductive compressible pad. Each respective compressible pad extends between rigid stops having a set height to limit gasket compression and enable repeatable gasket compressions for repeatable measurements with the handheld transfer impedance probe. An interconnection structure includes respective interconnects connecting between the coaxial RF connectors and the respective pair of independent electrical contacts and the common interconnect electrical contact. The respective interconnects are contained within the rigid probe housing body and arranged to prevent movement of the respective electrical contacts and the associated electrically conductive compressible pads.

In accordance with features of the invention, the compressible pads are replaceable and formed of mesh conductive fabric over foam or other electrically conductive compressible gasket material to make contact to the material and joint under test. The compressible pads provide repeatable gasket compression, for example, of approximately 40 percent for repeatable measurements.

In accordance with features of the invention, each respective interconnect is designed with an impedance, for example, to approach that of a 50 ohm transmission line.

In accordance with features of the invention, the rigid probe housing body and the rigid probe housing base member are formed of a selected electrically nonconductive material, such as a rigid plastic material.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and structures are provided for implementing an enhanced handheld transfer impedance probe.

Having reference now to the drawings, in FIGS. 1-11 there are shown not to scale an example structures for implementing an enhanced handheld transfer impedance probe generally designated by the reference character 100 in accordance with preferred embodiments.

The handheld transfer impedance probe 100 includes a rigid housing or body member generally designated by the reference character 102, a rigid probe housing base member generally designated by the reference character 104 and a joint type base module generally designated by the reference character 106. The handheld transfer impedance probe 100 includes a network analyzer connection generally designated by the reference character 108 carried at an upper end of the rigid probe housing body 102. The network analyzer connection 108 includes a pair of coaxial RF connectors 110, 112, such as, SubMinature Version A (SMA) coaxial RF connectors or other connector type. For example, the coaxial RF connector 110 provides a voltage port and the coaxial RF connector 112 provides a current port connection to a network analyzer.

The joint type base module 106 includes a flexible interconnect structure member 114, such as a ribbon type cable portion 114 extending outside the rigid probe housing body 102 and connected to a common interconnect contact 116. The base member 104 includes respective pair of independent electrical contacts 118, 120 respectively providing a current contact connection and a voltage contact connection for interconnection with the respective coaxial RF connectors 110, 112.

Figure 1:
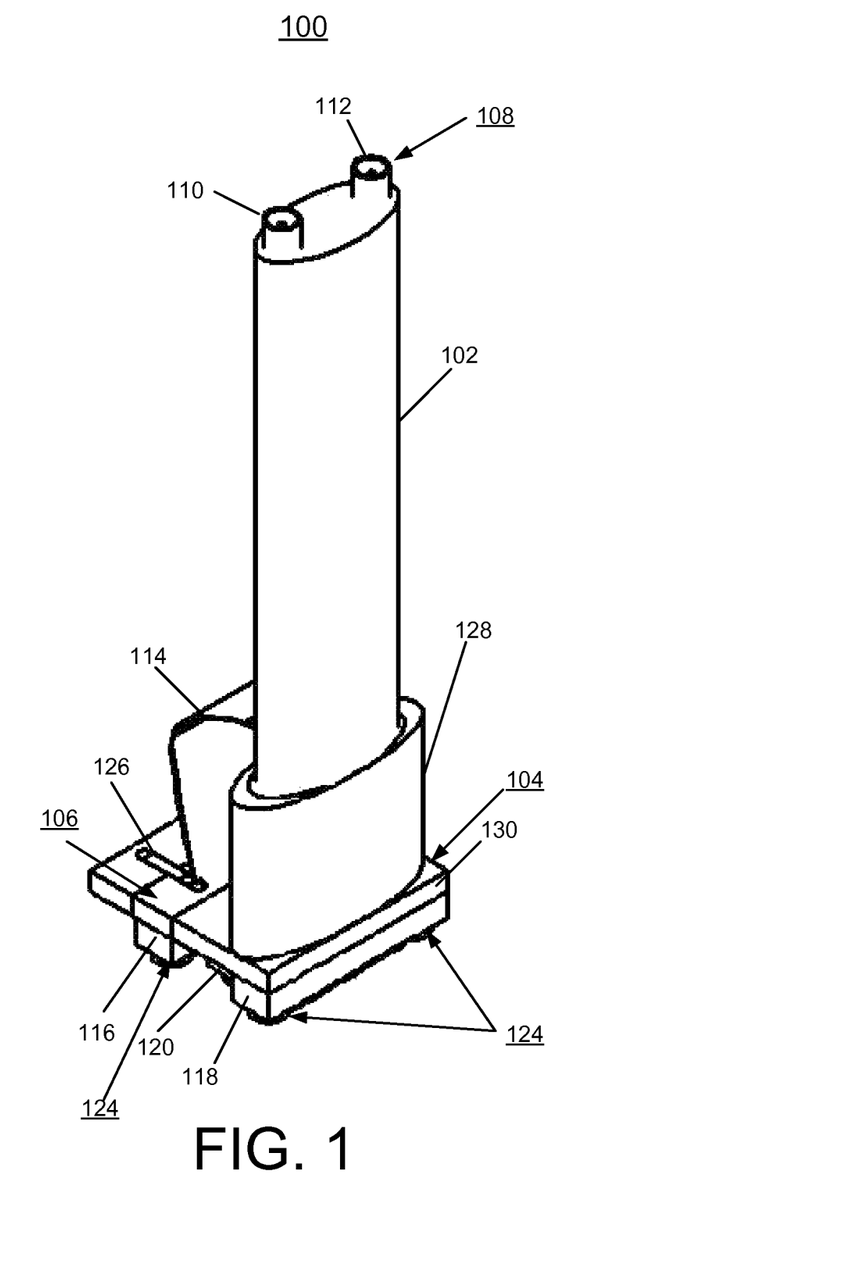
FIGS. 1 and 2 are perspective views not to scale of example structures for implementing an enhanced handheld transfer impedance probe in accordance with preferred embodiments.
Figure 2:
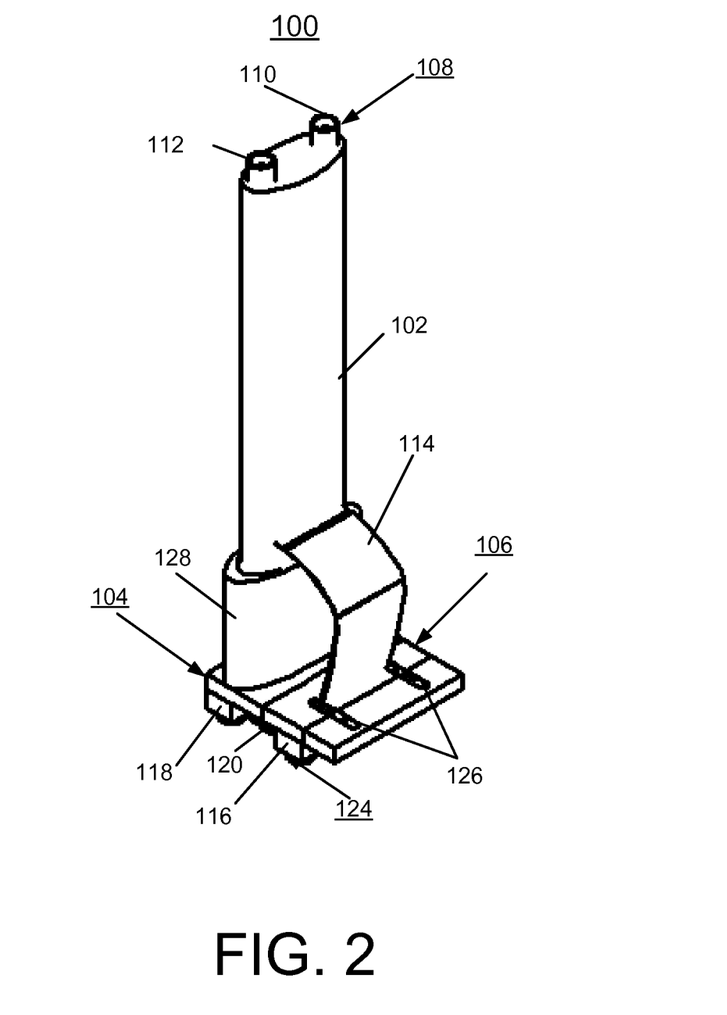
Figure 3:
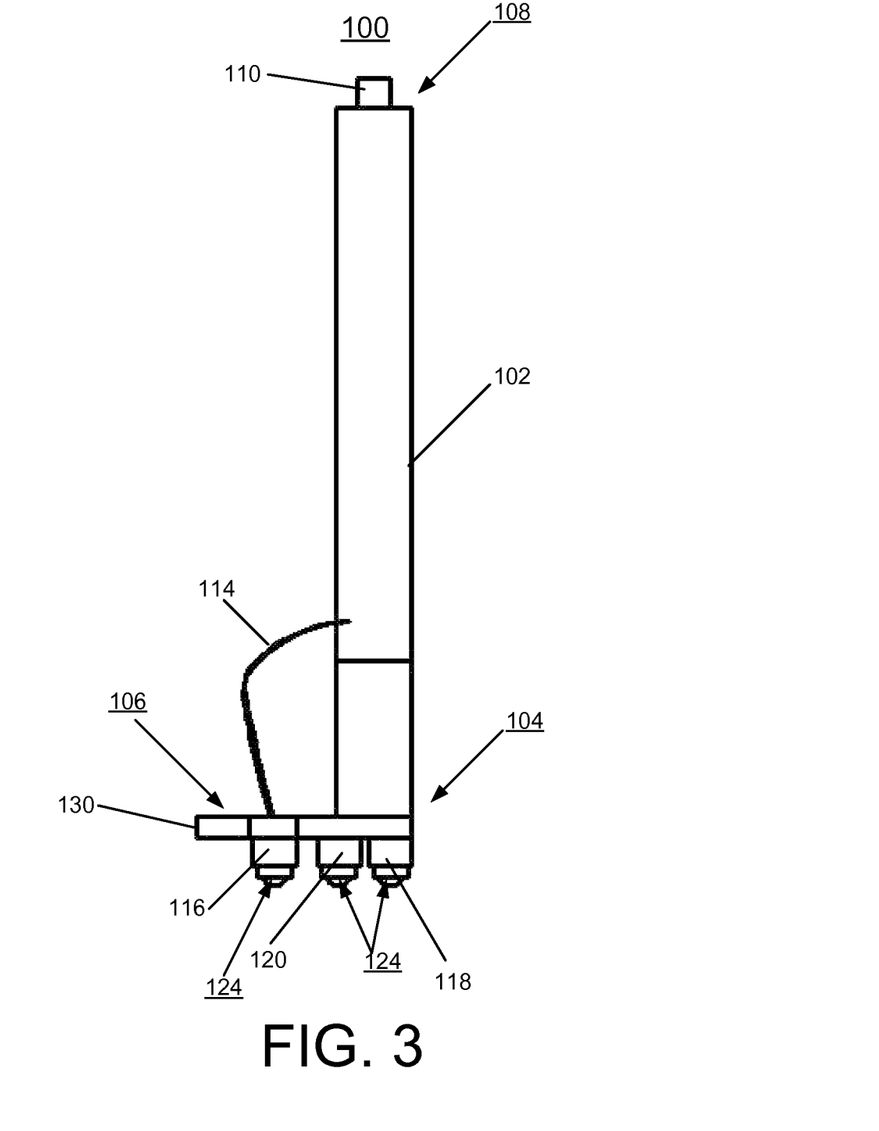
FIGS. 3, 4, and 5 are side views not to scale of example structures for implementing an enhanced handheld transfer impedance probe in accordance with preferred embodiments.
Figure 4:
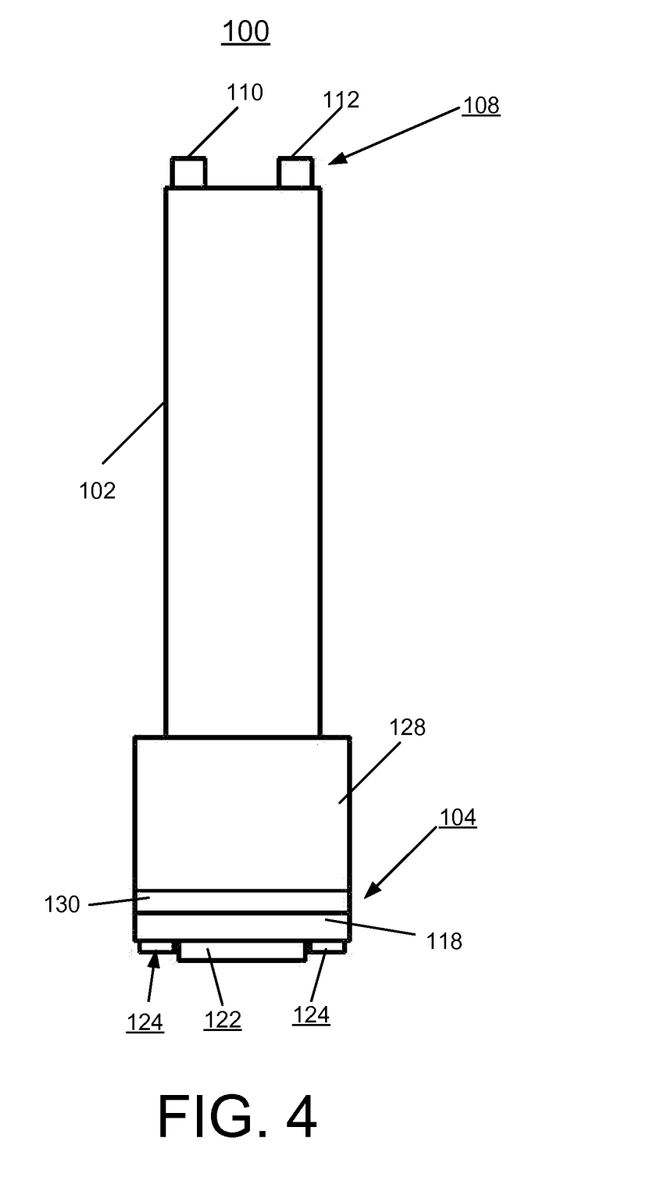
Figure 5:
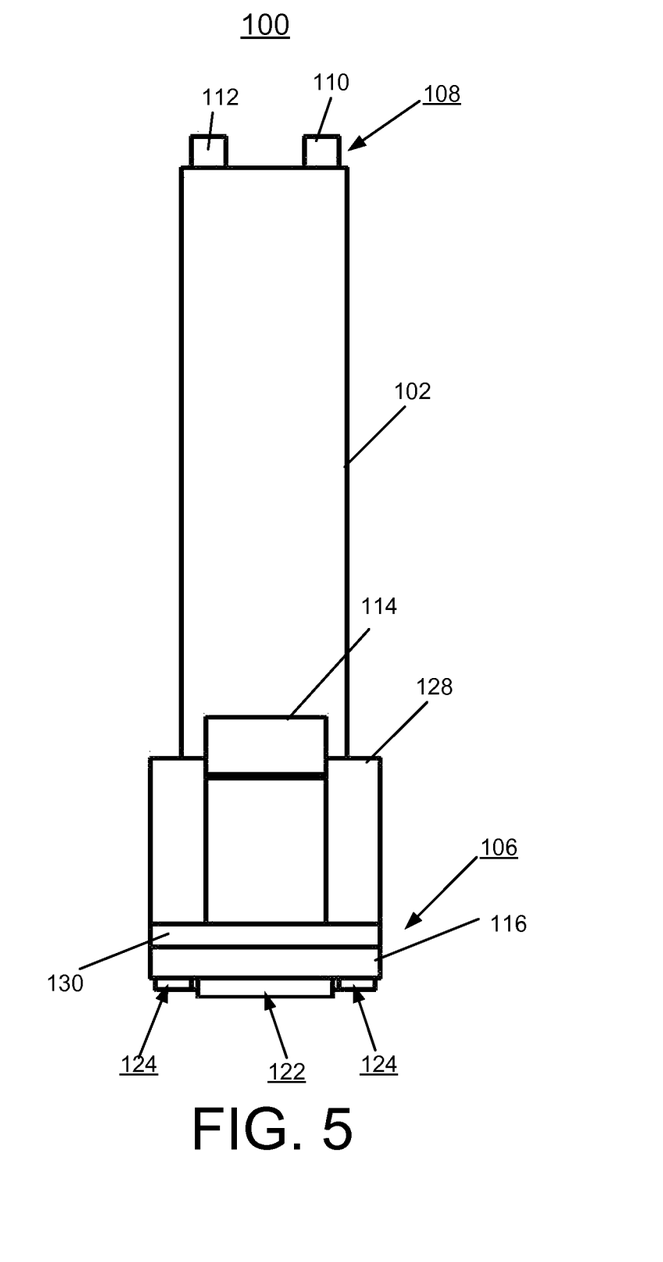
Figure 6:
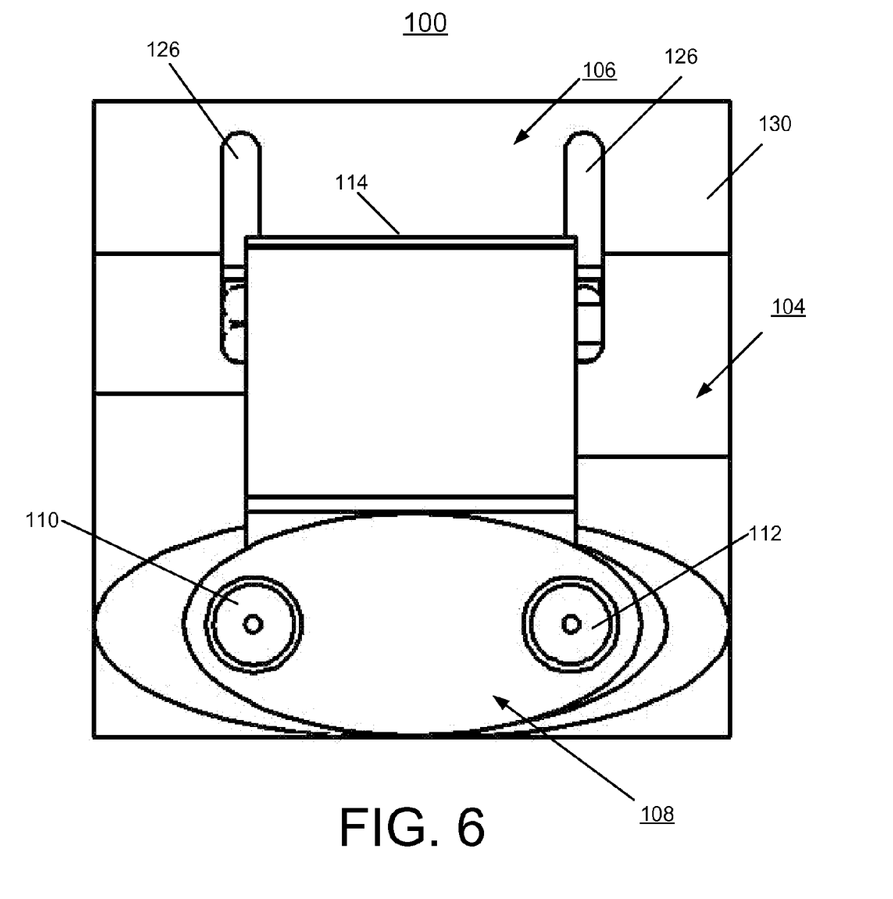
FIG. 6 is a top plan view not to scale of example structures for an enhanced handheld transfer impedance probe in accordance with preferred embodiments.
Figure 7:
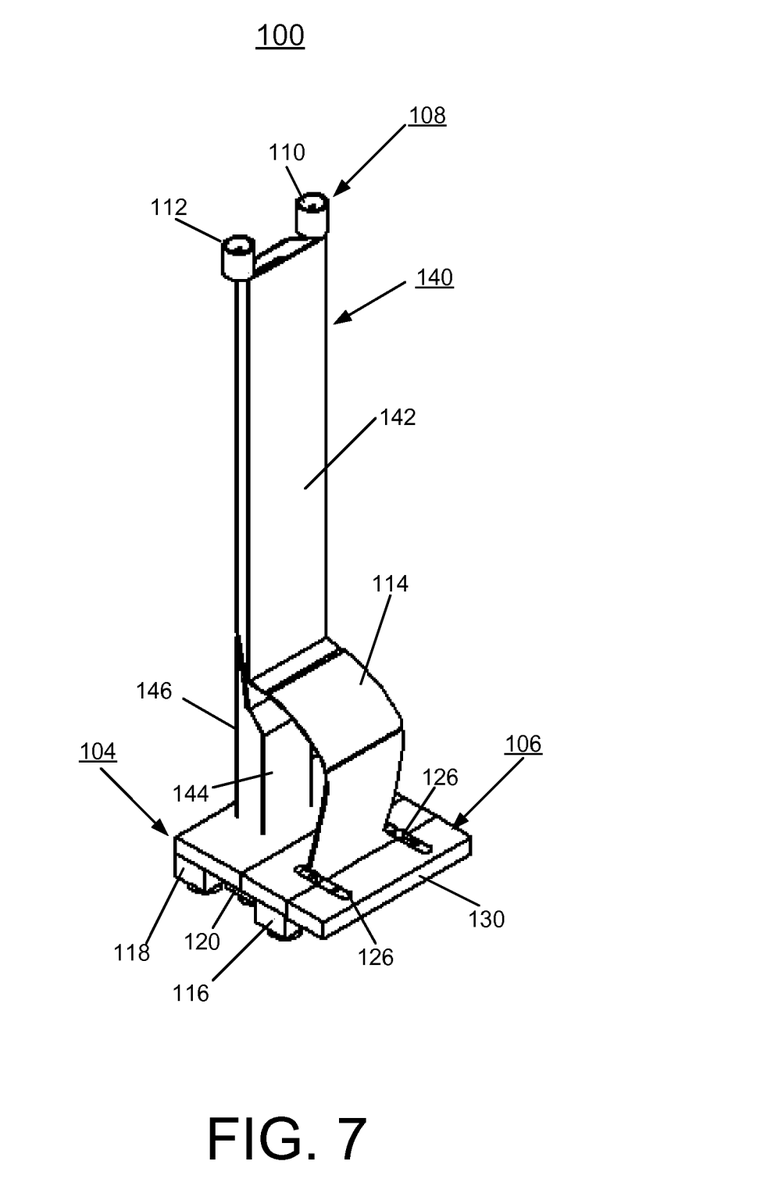
FIGS. 7, 8, 9, 10 and 11 are perspective views not to scale of example internal interconnection structures for implementing an enhanced handheld transfer impedance probe in accordance with preferred embodiments.
Figure 8:
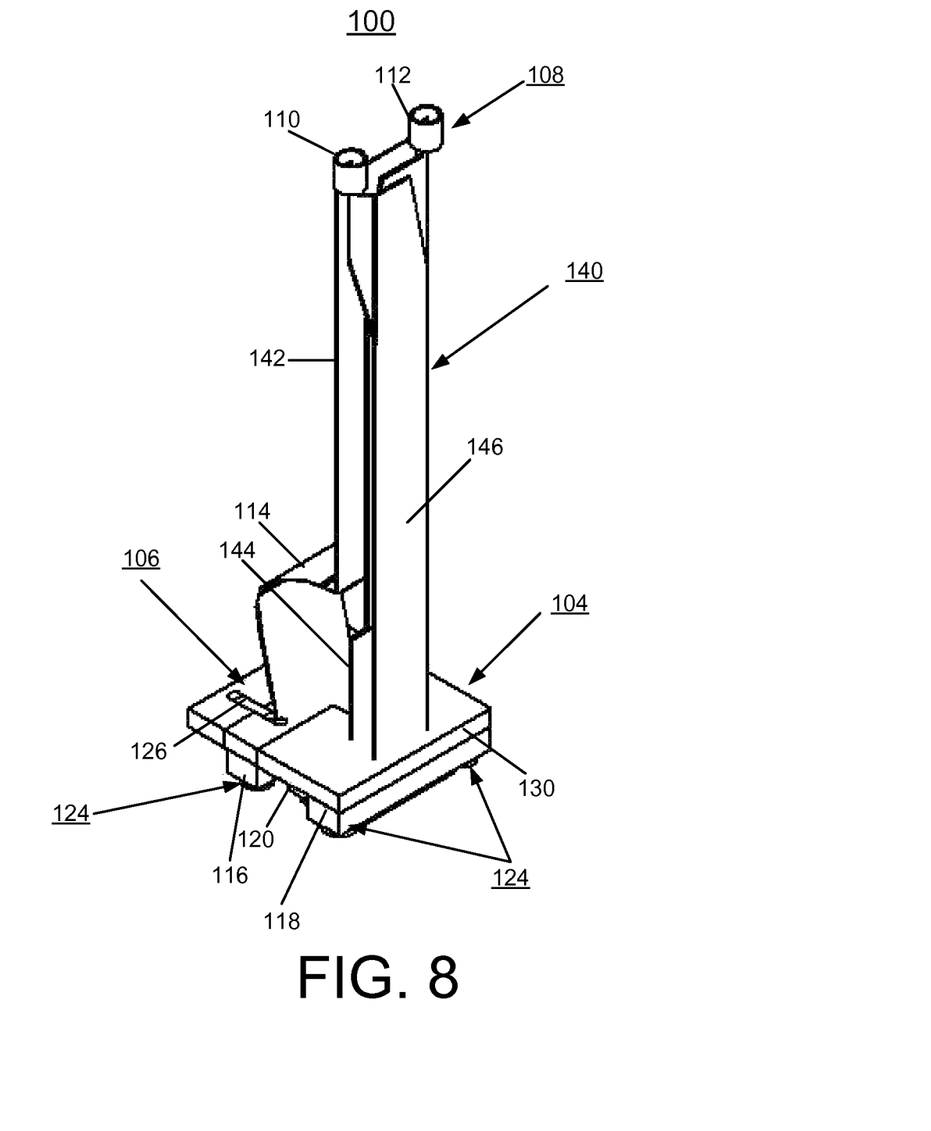
Figure 9:
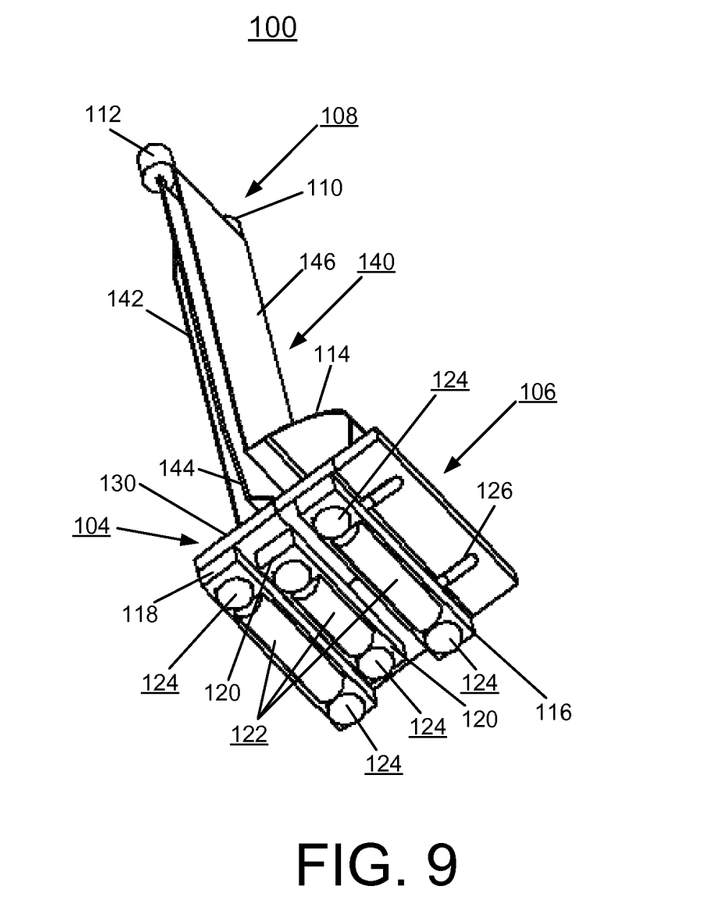
Figure 10:
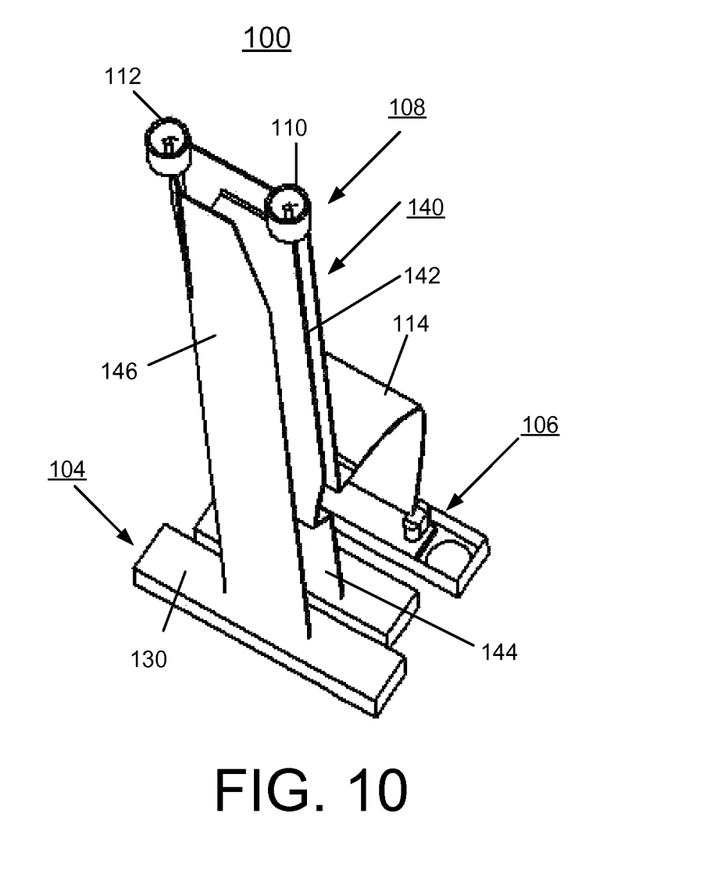
Figure 11:
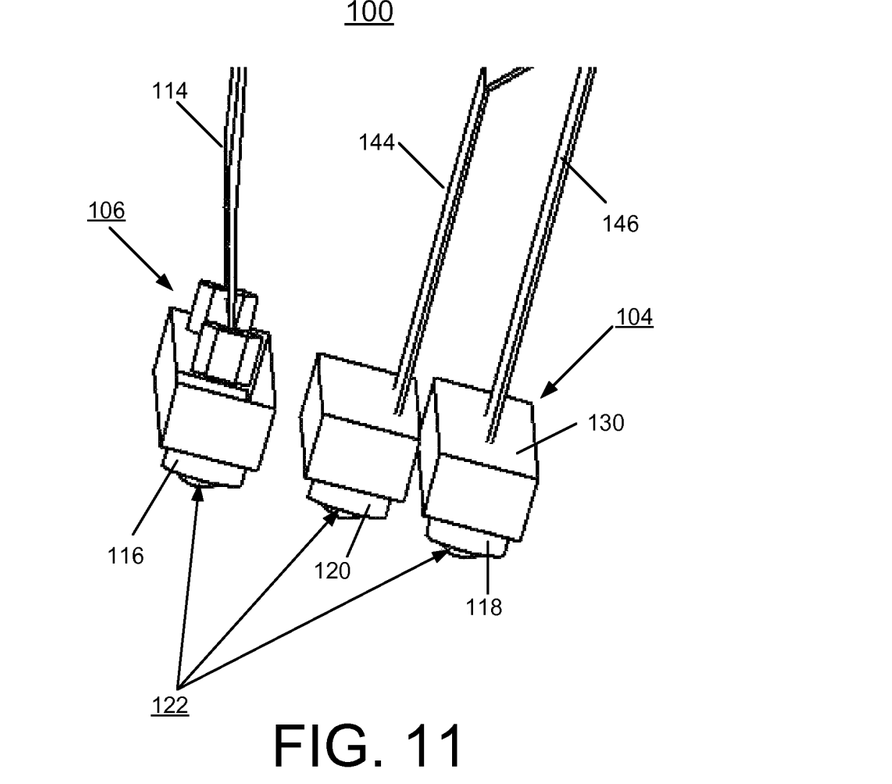

Referring now to FIG. 9, each of the respective electrical contacts 116, 118, 120 includes a respective associated electrically conductive compressible pad 122. Each of the electrical contacts 116, 118, 120 includes generally flat conductive members or straps, just wide enough to contact the full length of their respective gasket contact compressible pad 122. A respective pair of associated metal posts or stops 124 is provided with each electrically conductive compressible pad 122 of each electrical contacts 116, 118, 120. Each electrically conductive compressible pad 122 extends between the rigid stops 124, which have a set height to limit gasket compression and enable repeatable gasket compressions for repeatable measurements with the handheld transfer impedance probe 100. The compressible pads 122 together with the metal stops 124 enable repeatable gasket compression, for example, of approximately 40 percent for repeatable measurements.

Referring to FIGS. 1, 2, 6, 7, 8 and 9, a pair of slots 126 are formed through a base layer 130 receiving the flexible interconnect portion 114, to enable movement of the electrical contact 116 carried by the joint type base module 106. The probe body member 102 includes an enlarged portion 128 engaging the rigid probe housing base member 130 to receive and retain an internal interconnect structure of the handheld transfer impedance probe 100.

Referring also to FIGS. 7, 8, 9, 10, and 11, an interconnection structure generally designated by the reference character 140 includes respective interconnects 142, 144, 146 connecting between the coaxial RF connectors 110, 112 and the common interconnect electrical contact 116 via the flexible cable portion 114, and the respective pair of independent electrical contacts 118, 120.

The respective interconnects 142, 144, 146 contained within the rigid probe housing body 102 extending through a base layer 130 are arranged to prevent movement of the respective electrical contacts 118, 120 and the associated electrically conductive compressible pads 122. Each of interconnect structures 142, 144, 146 of the internal structure 140 is arranged to approximately provide a 50 ohm transmission line structure.

Each of the contacts 116, 118, 120 includes the flat conductive strap formed of a selected electrically conductive metal material receiving a respective electrically conductive compressive pad 122. The probe housing body 102 and the base members 104, 106 are formed of a selected electrically nonconductive material, such as a plastic material.

The compressible pads 122 are replaceable and formed, for example, of a conductive mesh fabric over foam or any of various electrically conductive compressible gasket materials to make contact to the material and joint under test. For example, the compressible pads 122 on the bottom of the base 104, 106 of the probe 100 together with the cooperating metal stops 124 provide repeatable gasket compression of approximately 40 percent for repeatable measurements.

In operation, the handheld transfer impedance probe 100 is calibrated using the functions of the network analyzer (not shown) along with a section of jointless material. Then, the probe 100 is placed into position across a joint and all electrical conductive gaskets 122 are compressed until they come to their stops defined by metal stops 124. The measurement is then taken across the joint by an S21 measurement on the network analyzer.

While the present invention has been described with reference to the details of the embodiments of the invention shown in the drawing, these details are not intended to limit the scope of the invention as claimed in the appended claims.

What is claimed is:

1. A structure for implementing an enhanced handheld transfer impedance probe comprising:
    a rigid probe housing body having an upper portion carrying a pair of coaxial RF connectors providing connections to a network analyzer;
    said rigid probe housing body being an elongated housing body with a rigid base member spaced apart from said upper portion;
    said rigid base member including a respective pair of independent electrical contacts providing a current contact and a voltage contact, and a common interconnect electrical contact;
    a flexible interconnect structure member extending outside the rigid probe housing body and connected to said common interconnect electrical contact;
    a respective electrically conductive compressible pad associated with each of said electrical contacts; each of said electrical contacts being a generally flat conductive member having a width substantially equal to and contacting a length of said respective electrically conductive compressible pad;
    cooperating stops associated with each said electrically conductive compressible pad for enabling repeatable pad-compression for repeatable measurements with the handheld transfer impedance probe; said cooperating stops having a set height to limit compressible pad compression;
    an internal structure of the rigid probe housing body including respective interconnects connecting between respective coaxial RF connectors and respective electrical contacts, and said common interconnect electrical contact via said flexible interconnect structure member, said respective interconnects being contained within the rigid probe housing body, extending through said rigid base member and arranged to prevent movement of said electrical contacts; and
    each said respective electrically conductive compressible pad providing repeatable compression for repeatable measurements.

2. The structure as recited in claim 1 wherein each of said electrical contacts is formed of a selected electrically conductive material.

3. The structure as recited in claim 1 wherein each of said rigid probe housing body and said base member is formed of a selected electrically nonconductive material.

4. The structure as recited in claim 1 wherein each of said rigid probe housing body and said base member is formed of a rigid plastic material.

5. The structure as recited in claim 4 wherein said respective interconnects are arranged as approximately 50 ohm transmission line structures.

6. The structure as recited in claim 1 wherein said electrical conductive compressible stop pads include a conductive mesh fabric over foam compressible pad.

7. The structure as recited in claim 1 wherein said compressible stop pads are formed of a selected electrical conductive compressible material.

8. The structure as recited in claim 1 wherein said compressible stop pads are replaceable compressible pads.

9. The structure as recited in claim 1 wherein said coaxial RF connectors include SubMinature Version A (SMA) coaxial RF connectors.

10. A method for implementing an enhanced handheld transfer impedance probe comprising:

provi­ding a rigid probe housing body having an upper portion with a pair of coaxial RF connectors providing connections to a network analyzer;

said rigid probe housing body being an elongated housing body with a rigid base member spaced apart from said upper portion;

providing said rigid base member including a respective pair of independent electrical contacts providing a current contact and a voltage contact, and a common interconnect electrical contact;

providing a flexible interconnect structure member extending outside the rigid probe housing body and connected to said common interconnect electrical contact;

providing a respective electrically conductive compressible pad associated with each of said electrical contacts; each of said electrical contacts being a generally flat conductive member having a width substantially equal to and contacting a length of said respective electrically conductive compressible pad;

providing cooperating stops associated with each said electrically conductive compressible pad for enabling repeatable pad compression for repeatable measurements with the handheld transfer impedance probe; said cooperating stops having a set height to limit compressible pad compression;

providing an internal structure of the rigid probe housing body including respective interconnects connecting between respective coaxial RF connectors and respective electrical contacts, and said common interconnect electrical contact via said flexible interconnect structure member, said respective interconnects being contained within the rigid probe housing body, extending through said rigid base member and arranged to prevent movement of said electrical contacts; and providing each said respective electrically conductive compressible pad to provide repeatable compression for repeatable measurements.

11. The method as recited in claim 10 wherein the step of providing a rigid probe housing body with a pair of coaxial RF connectors includes forming said rigid probe housing body with a selected electrically nonconductive material.

12. The method as recited in claim 11 includes forming said rigid probe housing body with a selected plastic material.

13. The method as recited in claim 11 includes providing SubMinature Version A (SMA) coaxial RF connectors.

14. The method as recited in claim 10 wherein the step of providing a base member including a respective pair of independent electrical contacts and a common interconnect electrical contact includes forming said base member with a selected electrically nonconductive material.

15. The method as recited in claim 14 includes forming said base member with a selected plastic material.

16. The method as recited in claim 14 wherein the step of providing cooperating stops associated with each said electrically conductive compressible pad includes forming said cooperating stops with metal posts.

17. The method as recited in claim 16 includes providing said metal posts with a predefined height to limit compressible pad compression.

18. The method as recited in claim 10 wherein the step of providing respective associated compressible pads includes forming said compressible pads with an electrically conductive fabric over foam material.

19. The method as recited in claim 10 wherein the step of providing respective associated compressible pads includes forming replaceable compressible pads of a selected electrically conductive compressible material.

20. The method as recited in claim 10 wherein the step of providing said internal structure of the rigid probe housing body including respective interconnects includes providing said respective interconnects arranged as approximately 50 ohm transmission line structures.

\* \* \* \* \*